(12) United States Patent
Chang et al.

(10) Patent No.: US 11,776,889 B2
(45) Date of Patent: Oct. 3, 2023

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Chih-Hsin Chang, Kaohsiung (TW); Tsu-Hsiu Wu, Kaohsiung (TW); Tsung-Yueh Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 32 days.

(21) Appl. No.: 17/336,072

(22) Filed: Jun. 1, 2021

(65) Prior Publication Data
US 2021/0296244 A1 Sep. 23, 2021

Related U.S. Application Data

(63) Continuation of application No. 16/358,378, filed on Mar. 19, 2019, now Pat. No. 11,024,570.

(51) Int. Cl.
| | |
|---|---|
| *H01L 23/538* | (2006.01) |
| *H01L 23/498* | (2006.01) |
| *H01L 23/00* | (2006.01) |
| *H01L 25/065* | (2023.01) |
| *H01L 25/00* | (2006.01) |
| *H01L 33/62* | (2010.01) |
| *H01S 5/022* | (2021.01) |

(52) U.S. Cl.
CPC .. *H01L 23/49838* (2013.01); *H01L 23/49811* (2013.01); *H01L 23/5384* (2013.01); *H01L 23/5386* (2013.01); *H01L 24/16* (2013.01); *H01L 25/0657* (2013.01); *H01L 25/50* (2013.01); *H01L 33/62* (2013.01); *H01S 5/022* (2013.01); *H01L 25/0652* (2013.01); *H01L 2224/16145* (2013.01); *H01L 2224/16227* (2013.01); *H01L 2225/06562* (2013.01)

(58) Field of Classification Search
None
See application file for complete search history.

(56) References Cited

U.S. PATENT DOCUMENTS

| | | | |
|---|---|---|---|
| 9,837,381 B2* | 12/2017 | Heinrich | ................. H01L 24/05 |
| 2018/0045885 A1 | 2/2018 | Canali et al. | |

OTHER PUBLICATIONS

Non-Final Office Action for U.S. Appl. No. 16/358,378, dated Aug. 20, 2020, 6 pages.
Notice of Allowance for U.S. Appl. No. 16/358,378, dated, Jan. 22, 2021, 5 pages.

* cited by examiner

*Primary Examiner* — Long Pham
(74) *Attorney, Agent, or Firm* — FOLEY & LARDNER LLP

(57) ABSTRACT

A semiconductor device package includes a carrier provided with a first conductive element, a second conductive element arranged on a semiconductor disposed on the carrier, and a second semiconductor device disposed on and across the first conductive element and the first semiconductor device, wherein the first conductive element having a surface that is substantially coplanar with a surface of the second conductive element.

18 Claims, 17 Drawing Sheets

SEMICONDUCTOR PACKAGE DEVICE AND METHOD OF MANUFACTURING THE SAME

CROSS-REFERENCE TO RELATED APPLICATION

This application is a continuation of U.S. patent application Ser. No. 16/358,378 filed Mar. 19, 2019, the contents of which is incorporated herein by reference in its entirety.

BACKGROUND

1. Technical Field

The subject application relates generally to a semiconductor package device and a method of manufacturing the same.

2. Description of the Related Art

A semiconductor device package includes a carrier and one or more semiconductor devices. Some of the semiconductor devices may be stacked in the semiconductor device package. Coplanarity is desired in bonding or attaching a semiconductor device to another semiconductor device and bonding structure of the carrier.

SUMMARY

In one or more embodiments, a semiconductor device package includes a carrier having a first substantially uneven surface and a second surface above the first substantially uneven surface, a planarization layer disposed on the first substantially uneven surface of the carrier, the planarization layer having a first surface and a second surface opposite to the first surface, and a first semiconductor device disposed on the first surface of the planarization layer, the first semiconductor device having a first surface lower than the second surface of the carrier.

In one or more embodiments, a semiconductor device package includes a carrier having a first surface, a second surface above the first surface and a third surface above the second surface, a first semiconductor device disposed on the first surface of the carrier, the first semiconductor device having a first surface lower than the third surface of the carrier, a first conductive element disposed on the second surface of the carrier, the first conductive element having a first surface; and a second conductive element disposed on the first surface of the first semiconductor device, the second conductive element having a first surface, wherein the first surface of the first conductive element is substantially the same in elevation to the first surface of the second conductive element.

In one or more embodiments, a method of manufacturing a semiconductor device package includes forming a planarization layer on a first surface of a carrier, the carrier having a second surface above the first surface; picking a first semiconductor device by a first end of a holder, the holder having a second end above the first end; moving the first semiconductor device toward a planarization layer; and stopping the first semiconductor device once the second end of the holder is in contact with the second surface of the carrier.

BRIEF DESCRIPTION OF THE DRAWINGS

Aspects of the subject application are readily understood from the following detailed description when read with the accompanying drawings. It is noted that various features may not be drawn to scale, and the dimensions of the various features may be arbitrarily increased or reduced for clarity of discussion.

FIG. 4A, FIG. 4B, FIG. 4C and FIG. 4E illustrate a second method of manufacturing a semiconductor device package in accordance with some embodiments of the subject application.

FIG. 4A and FIG. 4F illustrate a third method of manufacturing a semiconductor device package in accordance with some embodiments of the subject application.

Common reference numerals are used throughout the drawings and the detailed description to indicate the same or similar elements.

DETAILED DESCRIPTION

Figure 1:
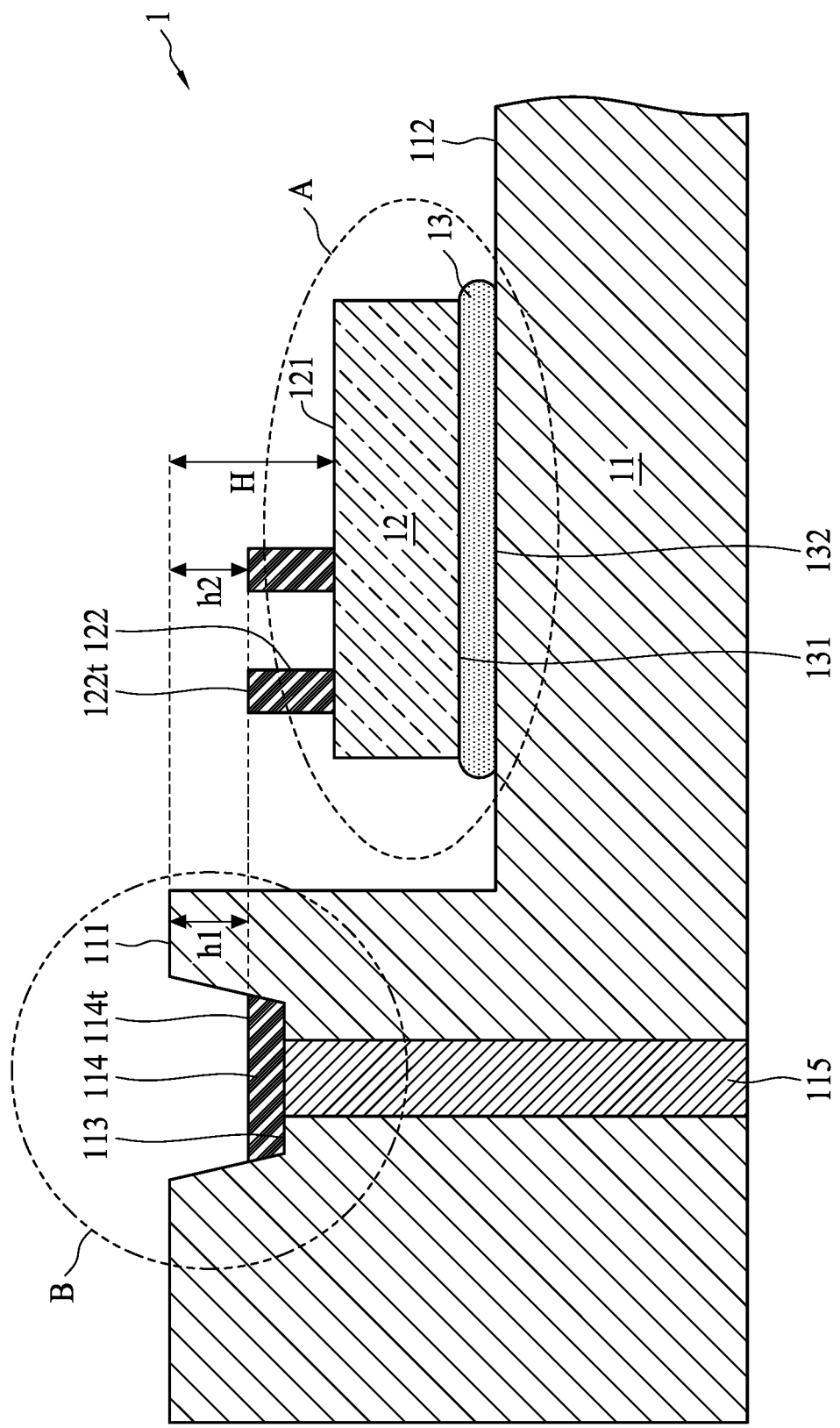
FIG. 1 illustrates a cross-sectional view of a semiconductor device package in accordance with some embodiments of the subject application.

FIG. 1 illustrates a cross-sectional view of a semiconductor device package 1 in accordance with some embodiments of the subject application. The semiconductor device package 1 includes a carrier 11, a semiconductor device 12 and a planarization layer 13.

The carrier 11 may be, or may include, a polymeric or a non-polymeric dielectric material. For example, the carrier 11 may include a flowable dielectric material in a hardened or semi-hardened state, such as a liquid crystal polymer, a resin with pre-impregnated fibers (e.g., a prepreg), Ajinomoto Buildup Film (ABF), a resin, an epoxy material, or other flowable dielectric material in a hardened or semi-hardened state. In some embodiments, the carrier 11 includes a single resin layer. In other embodiments, the carrier 11 includes multiple resin layers; for example, a first sub-layer formed of a resin and a second sub-layer formed of an enhanced resin (such as a resin enhanced by glass fibers or Kevlar fibers). In some embodiments, the carrier 11 includes a prepreg that may be in a single layer or multiple layers. In some embodiments, the carrier 11 includes at least one prepreg layer and at least one resin layer. The carrier 11 has a surface 112, a surface 113 over or above the surface 112 and a surface 111 over or above the surface 112 and surface 113.

The planarization layer 13 is disposed on the surface 112 of the carrier 11. The planarization layer 13 is in direct contact with the surface 112 of the carrier 11. The semiconductor device 12 is disposed on the planarization layer 13. The semiconductor device 12 is in direct contact with the planarization layer 13. There is a distance H between a surface 121 of the semiconductor device 12 and the surface 111 of the carrier 11. There is an elevation or level difference H between the surface 121 of the semiconductor device 12 and the surface 111 of the carrier 11.

The planarization layer 13 may include, not limited to, a bonding material. The bonding material is, for example but not limited to, a solder material, an adhesive, or other suitable material(s).

The planarization layer 13 has a surface 131 in direct contact with the semiconductor 12, and a surface 132 in contact with the surface 112 of the carrier 11. The surface 131 is opposite to the surface 132. The surface 131 of the planarization layer 13 may be parallel to the surface 121 of the semiconductor device 12.

The planarization layer 13 may have a thickness in a range in from about 20 μm to about 100 μm.

A conductive element 114 may be disposed on the surface 113 of the carrier 11. The connection element 114 may include a conductive bump or post or a conductive pad. The conductive element 114 has a surface 114t. There is a distance h1 between a surface 114t of the conductive element 114 and the surface 111 of the carrier 11. There is an elevation or level difference h1 between the surface 114t of the conductive element 114 and the surface 111 of the carrier 11.

An RDL 115 may be formed in the carrier 11. The RDL 115 may electrically connect to an external device. The conductive element 114 may electrically connect to the RDL 115. The conductive element 114 may be in direct contact with the RDL 115. The conductive element 114 may electrically connect to the external device through the RDL 115.

A conductive element 122 may be disposed on the surface 121 of the semiconductor device 12. The connection elements 122 may include conductive bumps, posts or pads. The conductive element 122 has a surface 122t. There is a distance h2 between the surface 122t of the conductive element 122 and the surface 111 of the carrier 11. There is an elevation or level difference h2 between the surface 122t of the conductive element 122 and the surface 111 of the carrier 11. The surface 122t of the conductive element 122 may be substantially parallel to the surface 114t of the conductive element 114. The surface 114t of the conductive element 114 may be substantially the same in elevation to the surface 122t of the conductive element 122. In the other words, the level difference h1 is substantially the same as the level difference h2.

The surface 121 may include an active surface. A circuitry of the semiconductor device 12 is adjacent to the surface 121. The semiconductor device 12 may include, for example, but is not limited to, a photonic integrated circuit, an optical die (e.g., a photonic die), a radio frequency die, a detector, or other integrated circuit.

The surface 112 may include a bottom surface of a cavity or a recess formed in the carrier 11.

Figure 2B:
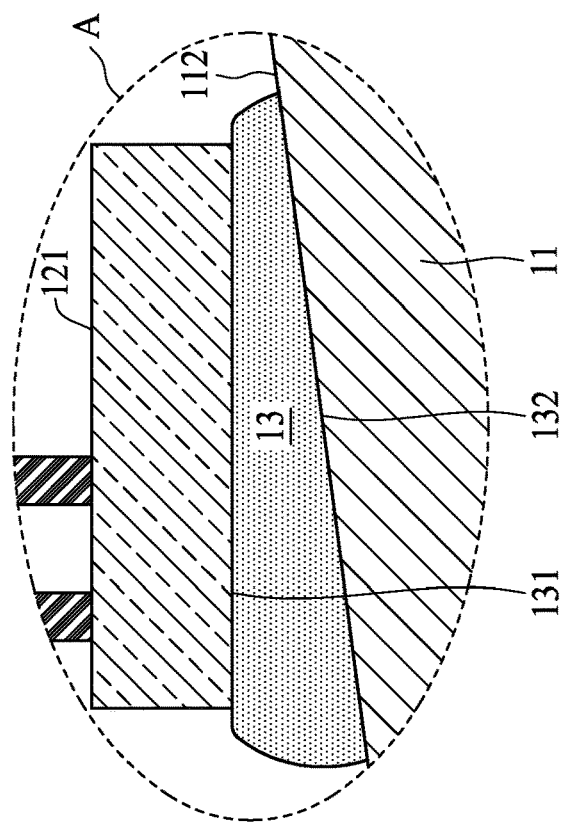
FIG. 2B illustrates an enlarged view of a portion of the semiconductor device package shown in FIG. 1.
Figure 2A:
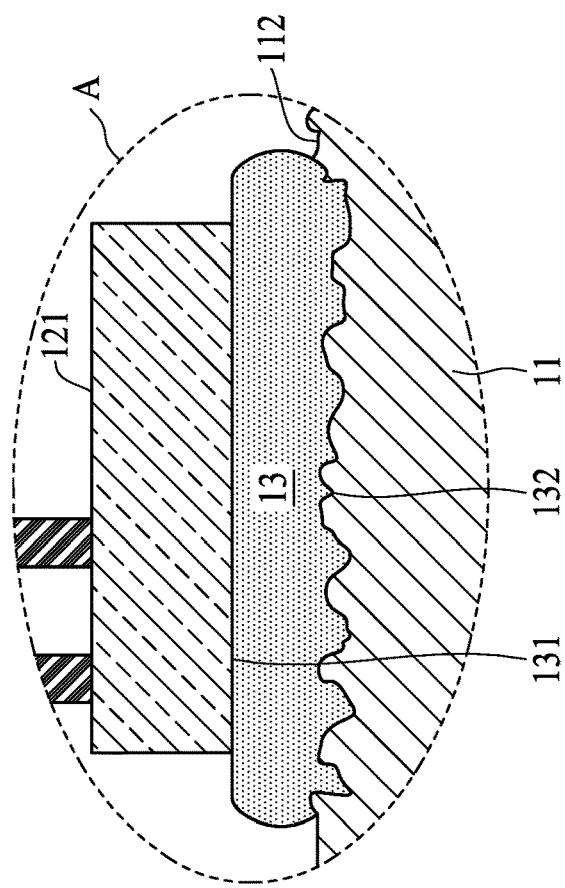
FIG. 2A illustrates an enlarged view of a portion of the semiconductor device package shown in FIG. 1.

FIG. 2A illustrates an enlarged view of a portion of the semiconductor device package 1 in a dotted-circle "A" as shown in FIG. 1. The surface 112 may be substantially not flat (e.g., resulting from a manufacturing deviation or tolerance). The surface 112 of the carrier 11 is uneven. The surface 132 of the planarization layer 13 may be uneven and engaged with the surface 112 of the carrier 11. The surface 132 of the planarization layer 13 may be conformal to the surface 112 of the carrier 11. The surface 132 of the planarization layer 13 may be compliant to the surface 112 of the carrier 11.

FIG. 2B illustrates an enlarged view of a portion of the semiconductor device package 1 in a dotted-circle "A" as shown in FIG. 1. The surface 112 of the carrier 11 is sloped with respect to the surface 121 of the semiconductor device 12. The surface 132 of the planarization layer 13 may be conformal to the surface 112 of the carrier 11. The surface 132 of the planarization layer 13 may be compliant to the surface 112 of the carrier 11. The surface 132 of the planarization layer 13 is sloped with respect to the surface 121 of the semiconductor device 12.

Figure 2D:
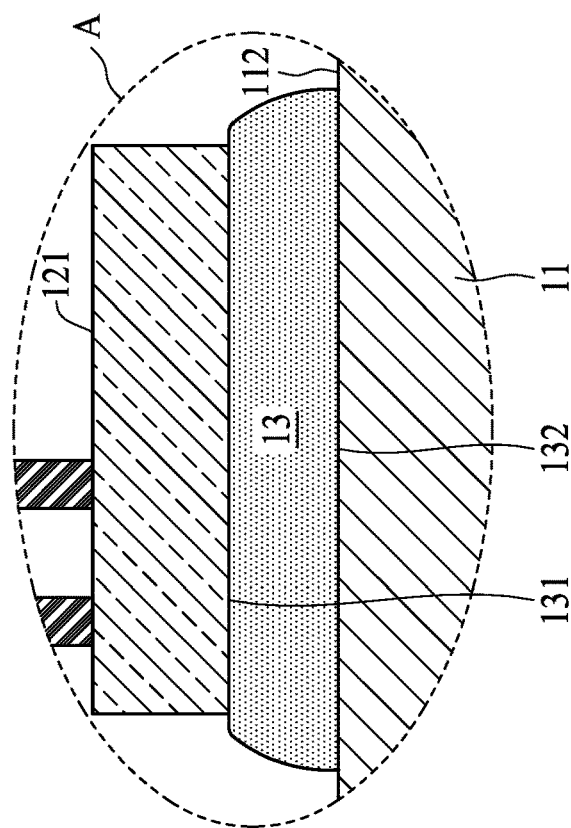
FIG. 2D illustrates an enlarged view of a portion of the semiconductor device package shown in FIG. 1.
Figure 2C:
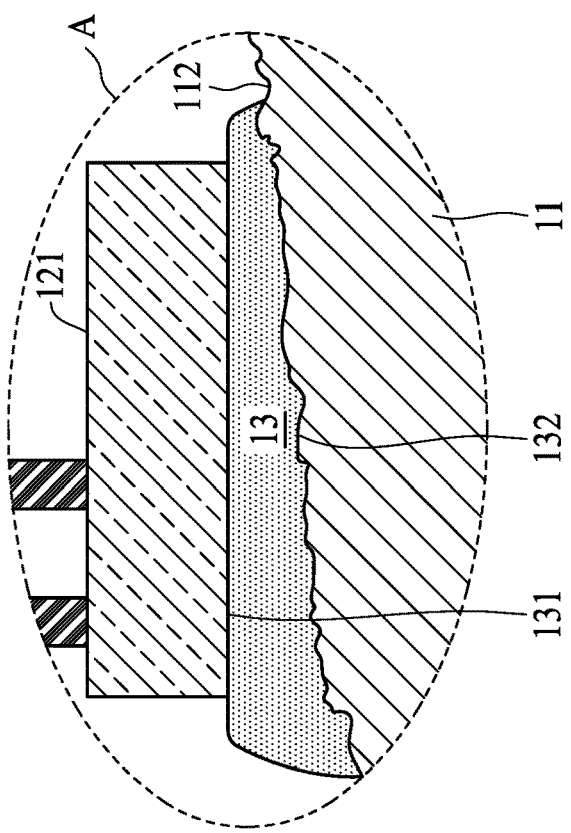
FIG. 2C illustrates an enlarged view of a portion of the semiconductor device package shown in FIG. 1.

FIG. 2C illustrates an enlarged view of a portion of the semiconductor device package 1 in a dotted-circle "A" as shown in FIG. 1. The surface 112 of the carrier 11 is uneven and sloped with respect to the surface 121 of the semiconductor device 12. The surface 132 of the planarization layer 13 may be conformal to the surface 112 of the carrier 11. The surface 132 of the planarization layer 13 may be compliant to the surface 112 of the carrier 11. The surface 132 of the planarization layer 13 may be engaged with the surface 112 of the carrier. The surface 132 of the planarization layer 13 is uneven and sloped with respect to the surface 121 of the semiconductor device 12.

FIG. 2D illustrates an enlarged view of a portion of the semiconductor device package 1 in a dotted-circle "A" as shown in FIG. 1. The planarization layer 13 arranged between the carrier 11 and the semiconductor device 12 may be formed in various types. The planarization layer 13 may have a trapezoid-like shape.

Figure 2F:
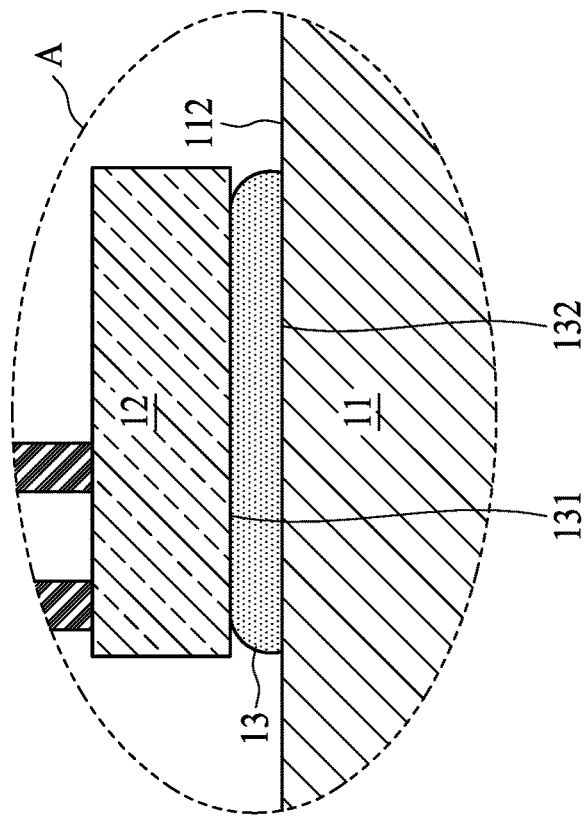
FIG. 2F illustrates an enlarged view of a portion of the semiconductor device package shown in FIG. 1.
Figure 2E:
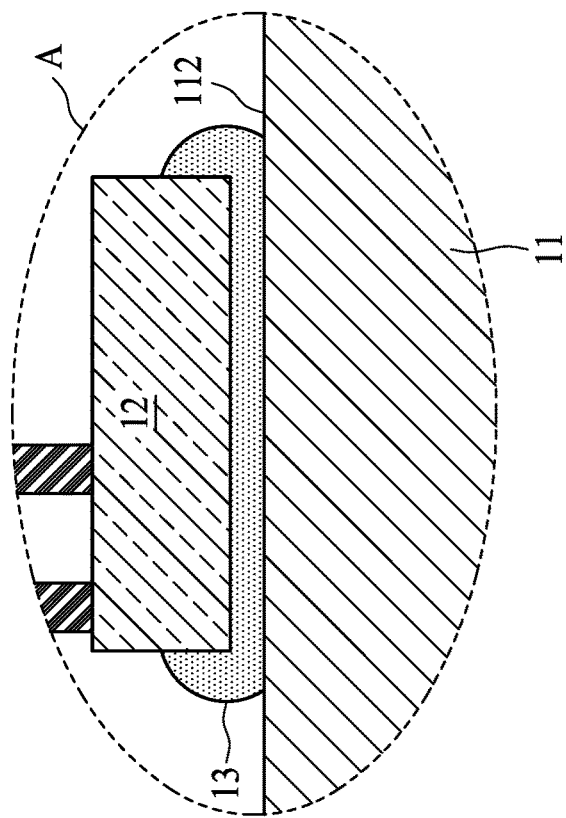
FIG. 2E illustrates an enlarged view of a portion of the semiconductor device package shown in FIG. 1.

FIG. 2E illustrates an enlarged view of a portion of the semiconductor device package 1 in a dotted-circle "A" as shown in FIG. 1. The planarization layer 13 may have a wedge-like shape.

FIG. 2F illustrates an enlarged view of a portion of the semiconductor device package 1 in a dotted-circle "A" as shown in FIG. 1. In some embodiments, the planarization layer 13 does not fill the space between the carrier 11 and the semiconductor device 12. The planarization layer 13 may be deposited within the periphery of the semiconductor device 12. In some embodiments, the planarization layer 13 is deposited at corners of the semiconductor device 12. In some embodiments, the planarization layer 13 is deposited at the center of the bottom surface of the semiconductor device 12 opposite to the surface 121. In some embodiments, the planarization layer 13 may be deposited to form a hollow pattern between the space between the carrier 11 and the semiconductor device 12.

Figure 2G:
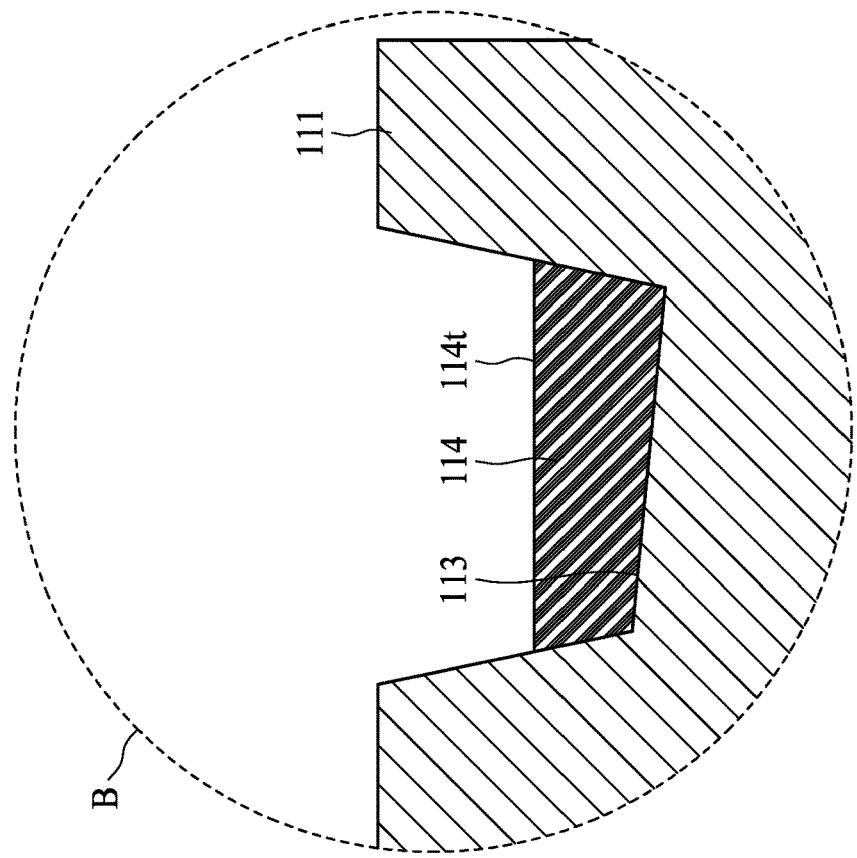
FIG. 2G illustrates an enlarged view of a portion of the semiconductor device package shown in FIG. 1.

FIG. 2G illustrates an enlarged view of a portion of the semiconductor device package 1 in a dotted-circle "B" as shown in FIG. 1. The surface 111 of carrier 11 may be sloped with respect to the surface 114t of the conductive element 114 (e.g., resulting from a manufacturing deviation or tolerance). The surface 111 of carrier 11 may be sloped with respect to the surface 121 of the semiconductor device 12.

Figure 2H:
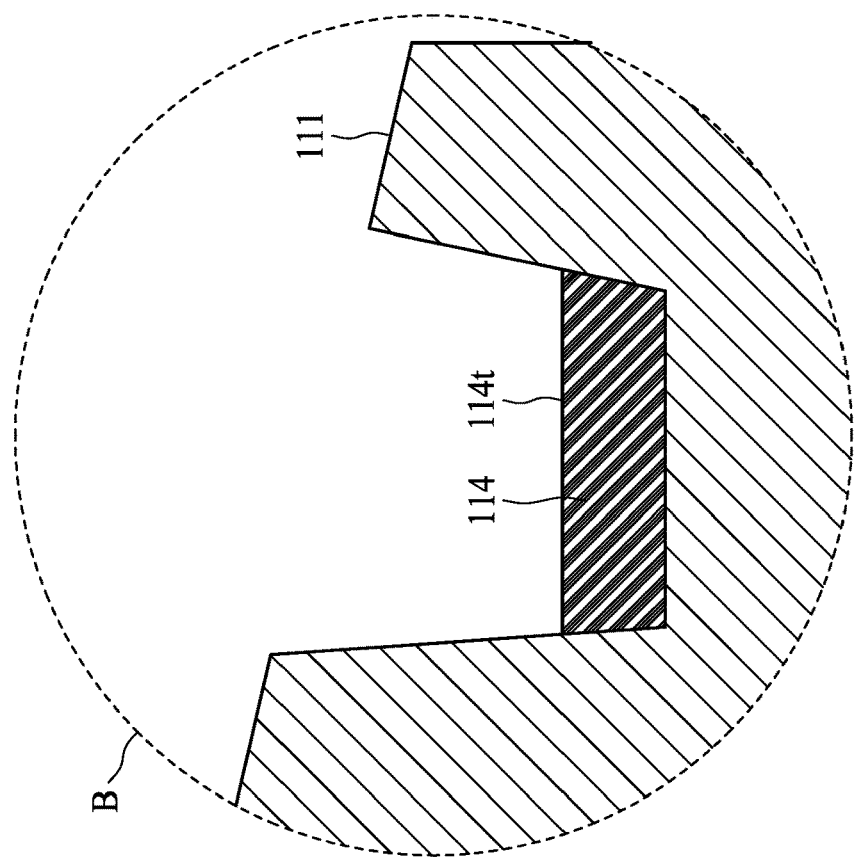
FIG. 2H illustrates an enlarged view of a portion of the semiconductor device package shown in FIG. 1.

FIG. 2H illustrates an enlarged view of a portion of the semiconductor device package 1 in a dotted-circle "B" as shown in FIG. 1. The carrier 11 is manufactured to have a recess having the surface 113. The surface 113 may be formed by a removing operation. The surface 113 may be sloped with respect to the surface 111 of the carrier 11 (e.g., resulting from a manufacturing deviation or tolerance). The surface 113 of carrier may be sloped with respect to the surface 114t of the conductive element 114 (e.g., resulting from a manufacturing deviation or tolerance). The surface 113 of carrier may be sloped with respect to the surface 121 of the semiconductor device 12.

Figure 3:
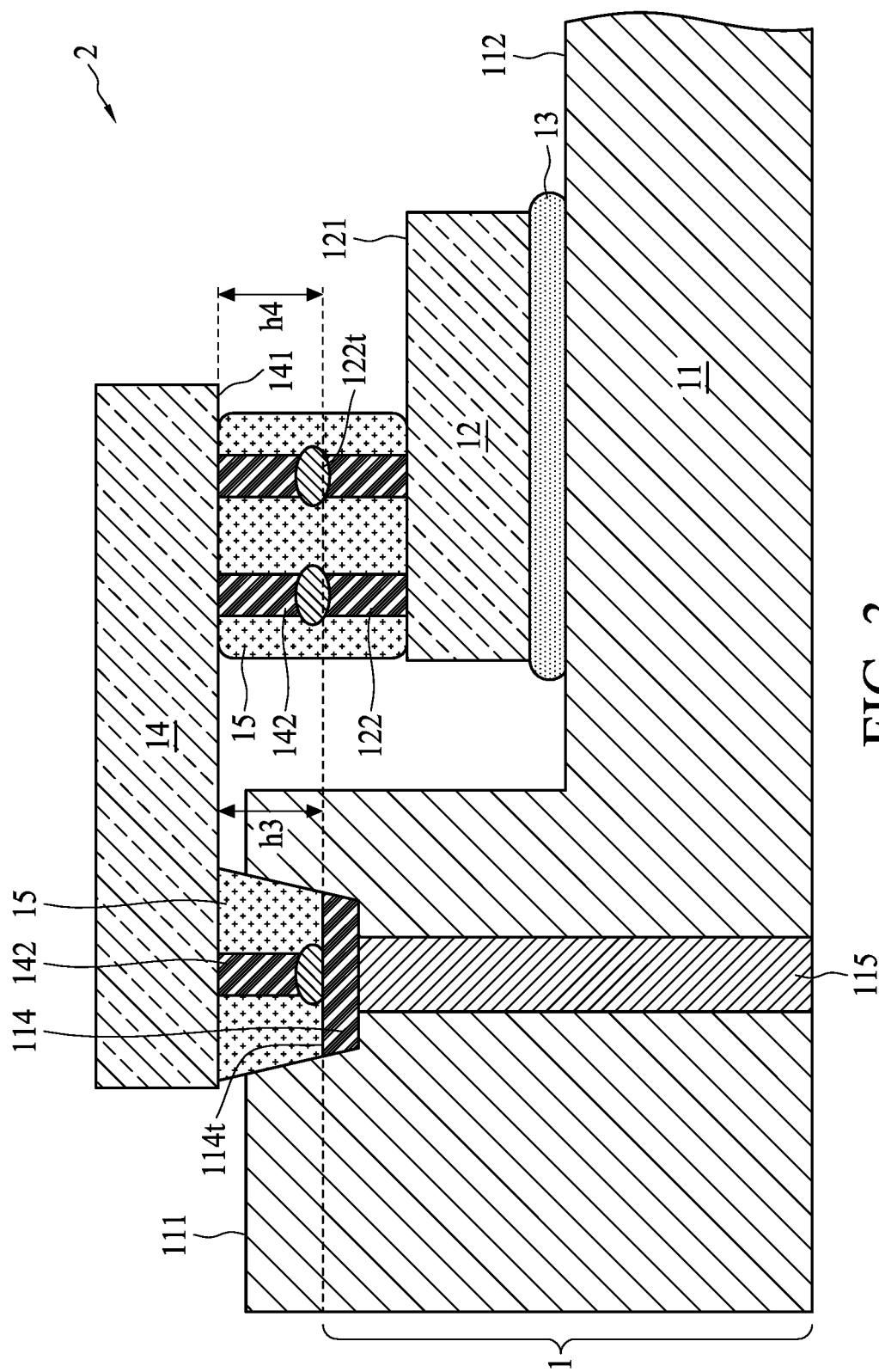
FIG. 3 illustrates a cross-sectional view of a semiconductor device package in accordance with some embodiments of the subject application.

FIG. 3 illustrates a cross-sectional view of a semiconductor device package 2 in accordance with some embodiments of the subject application. A semiconductor device 14 is deposited over or above the semiconductor device 12. The semiconductor device 14 is arranged above and across the semiconductor device 12 and the conductive element 114. The semiconductor device 14 has a surface 141. The surface 141 faces to the surface 121 of the semiconductor device 12 and faces to the surface 114t of the conductive element 114. The surface 141 of the semiconductor device 14 may be substantially in parallel to the surface 121 of the semiconductor device 12. The surface 141 of the semiconductor device 14 may be substantially parallel to the surface 111 of the carrier 11.

The surface 141 may include or may constitute at least part of an active surface. The semiconductor device 14 may include, for example, but is not limited to, a controller die, a processor die, an application specific integrated circuit (ASIC) die, a microcontroller unit (MCU) die, an RFID, a photonic integrated circuit, an optical die (e.g., a photonic die), a radio frequency die, a detector, an RFIC, or the like.

A conductive element 142 may be formed to be in direct contact with the surface 141 of the semiconductor device 14. The semiconductor device 14 is electrically connected to the conductive element 114 through the conductive element 142. The semiconductor device 14 is electrically connected to the semiconductor device 12 through the conductive element 142 and the conductive element 122.

A distance h3 may be defined from the surface 141 of the semiconductor device 14 to the surface 114t of the conductive element 114. A distance h4 may be defined from the surface 141 of the semiconductor device 14 to the surface 122t of the conductive element 122 has. The distance h3 may be substantially the same as the distance h4. The surface 122t of the conductive element 122 and surface 114t of the conductive element 114 may be substantially coplanar. The coplanar surface 122t and the surface 114t may be parallel to the surface 141 of the semiconductor device 14.

The semiconductor device 12, which has a surface 121 facing the surface 141 of the semiconductor device 14, is bonded to the semiconductor device 14 to form a face-to-face stack structure. Signal transmission may be performed between the semiconductor device 12 and the semiconductor device 14 through the conductive element 122 and the conductive element 142. Lateral or horizontal signal transmission (e.g. other than the conductive elements 122, 142) may be minimized or omitted to reduce transmission loss.

An encapsulant 15 may be formed between the semiconductor device 14 and the conductive element 114. The encapsulant 15 may be formed between the semiconductor device 14 and the semiconductor device 12. The encapsulant 15 may encapsulate the conductive element 142. The encapsulant 15 may also encapsulate the conductive elements 142 and 122.

Figure 4A:
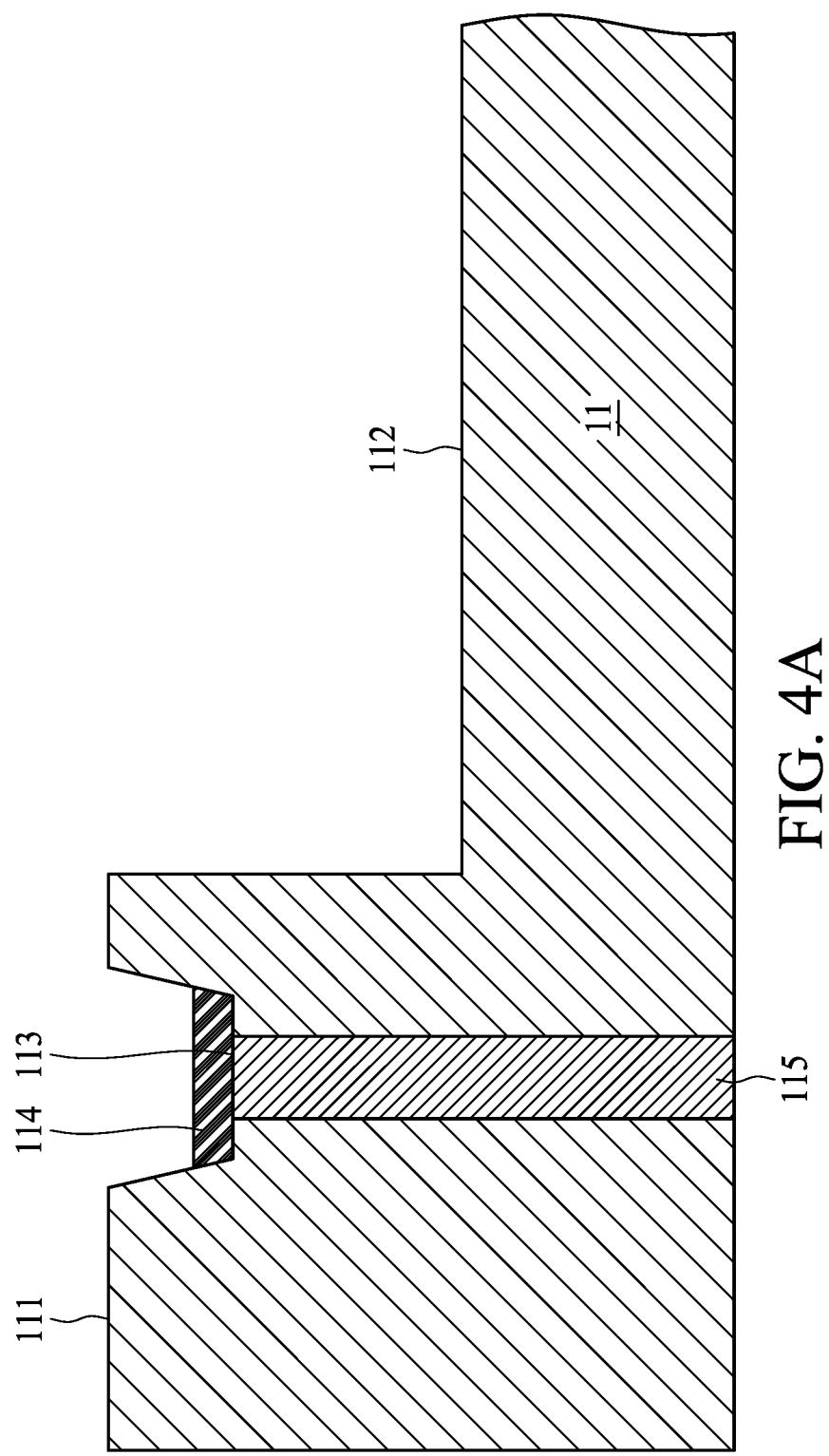
FIG. 4A, FIG. 4B and FIG. 4C illustrate a first method of manufacturing a semiconductor device package in accordance with some embodiments of the subject application.
Figure 4B:
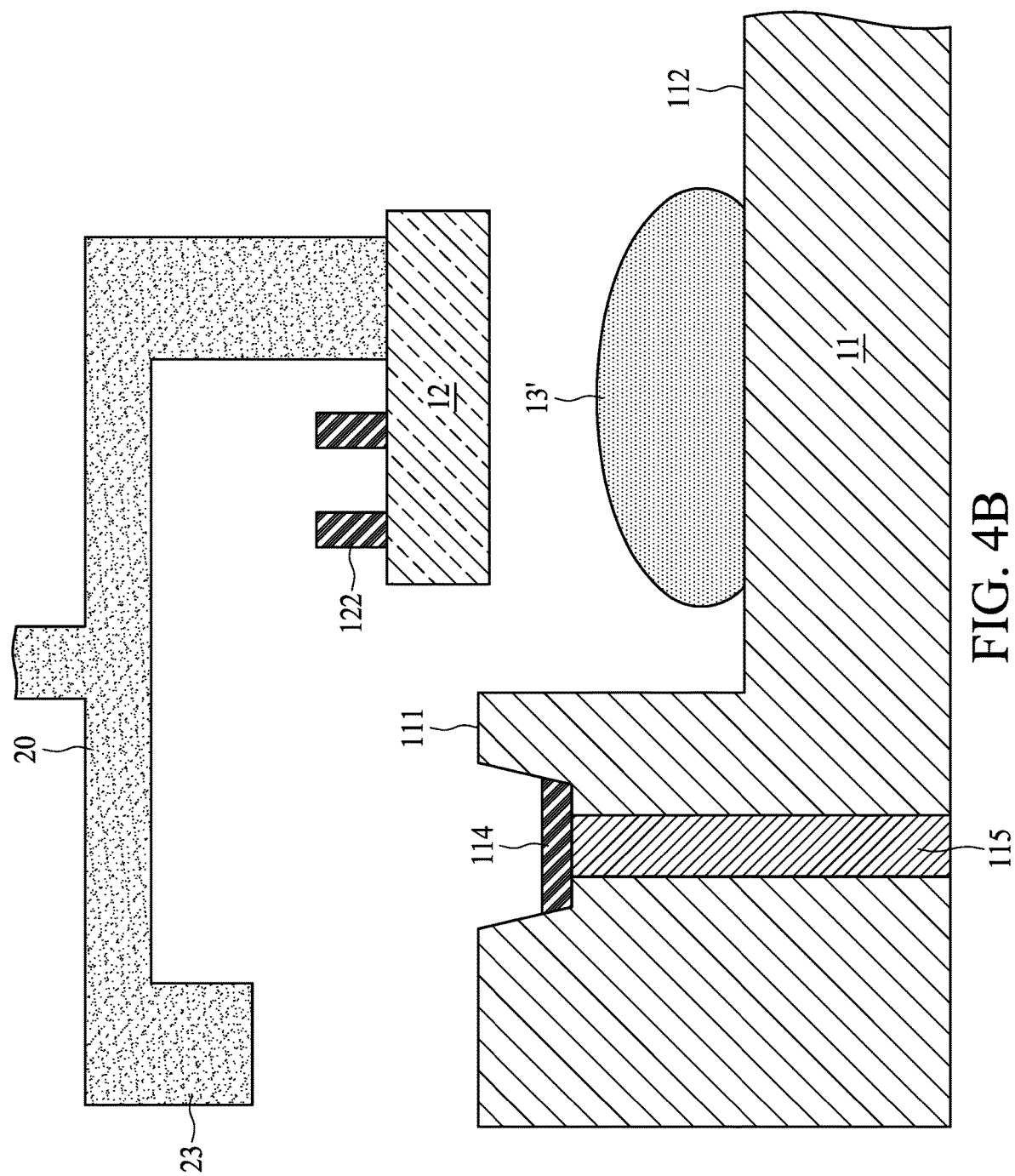
Figure 4C:
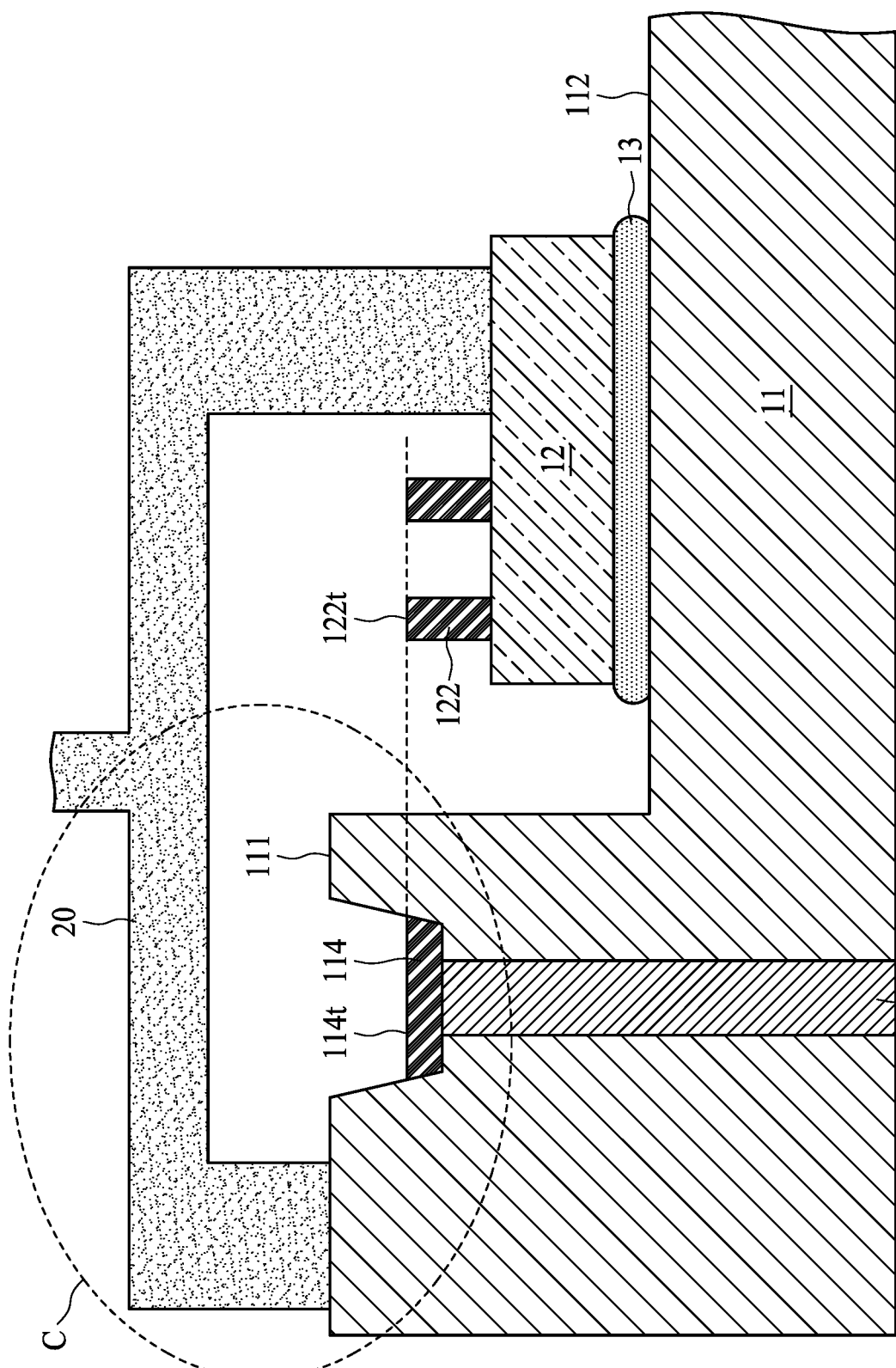

FIGS. 4A, 4B and 4C illustrate a method of manufacturing a semiconductor device package in accordance with some embodiments of the subject application.

Referring to FIG. 4A, a carrier 11 is provided. The carrier 11 is formed with a surface 112, a surface 113 and a surface 111. The surface 113 is formed over or above the surface 112, and the surface 111 is formed over or above the surface 113. A conductive element 114 is deposited on the surface 113. The carrier 11 may be manufactured to include an RDL structure 115.

The surface 112 may be formed by a removing process. The surface 112 may be formed by an etching operation (e.g., a chemical operation or plasma etch operation). The surface 112 may be formed by a mechanically removing operation. The surface 112 may be formed by optically removing operation.

The conductive element 114 may be formed by, for example but not limited to, implantation techniques. The conductive element 114 may include conductive bumps, posts, pads or the like.

Referring to FIG. 4B, a planarization material 13' is deposited on the surface 112 of the carrier 11. A holder 20 picks a semiconductor device 12. The semiconductor device 12 may be provided with a conductive element 122 on the surface 121. The conductive element 122 is formed in direct contact with the surface 121 of the semiconductor device 12.

The holder 20 may have a chuck connecting to a vacuum through a pipe (not shown in the drawings). The chuck of the holder 20 can pick the semiconductor device 12 with the vacuum. The holder 20 may further include a thermal conductive line (not shown in the drawings) which can thermally connect to a heater. In some embodiment, the holder 20 may include a heater. The holder 20 has a contact head 23.

Referring to FIG. 4C, the holder 20 picks the semiconductor device 12 and moves the semiconductor device 12 toward the surface 112 of the carrier 11. Upon the contact head 23 of the holder is in contact with the surface 111 of the carrier 11, the holder 20 stops.

The carrier 11, may be, or may include, a polymeric or a non-polymeric dielectric material. For example, the carrier 11 may include a flowable dielectric material in a hardened or semi-hardened state, such as a liquid crystal polymer, a resin with pre-impregnated fibers (e.g., a prepreg), Ajinomoto Buildup Film (ABF), a resin, an epoxy material, or other flowable dielectric material in a hardened or semi-hardened state. In some embodiments, the carrier 11 includes a single resin layer. In other embodiments, the carrier 11 includes multiple resin layers; for example, a first sub-layer formed of a resin and a second sub-layer formed of an enhanced resin (such as a resin enhanced by glass fibers or Kevlar fibers). In some embodiments, the carrier 11 includes a prepreg that may be in a single layer or multiple layers. In some embodiments, the carrier 11 includes at least one prepreg layer and at least one resin layer. The contact head 23 of the holder 20 may not damage the carrier 11 during the contact with the surface 111 of the carrier 11 because the carrier 11 includes relatively flexible or soft material.

While the semiconductor device 12 moves toward the surface 112 of the carrier 11, the planarization material 13' is compressed by the semiconductor device 12 to form a planarization layer 13. The semiconductor device 12 can be bonded to the surface 112 of the carrier 11 with the planarization layer 13. Subsequent to the compression process, the planarization material 13' may be cured through a curing operation. The planarization material 13' may be cured with heat from the holder 20. The planarization material 13' may be cured with an optical method, e.g., an UV curing operation or the like.

By the way of mechanically contacting the contact head 23 with the surface 111 of the carrier 11, the compression of the planarization material 13' can be well controlled. In addition, the planarization material 13' is soft or flexible, and the semiconductor device 12 would not be cracked or damaged during the compression operation. In the meanwhile, an amount of the movement of the semiconductor device 12 can be well controlled.

Upon the contact head 23 is in contact with the surface 111 of the carrier 11, the surface 122t of the conductive 122 may be substantially parallel to the surface 114t of the conductive element 114. The surface 122t of the conductive element 122 may substantially the same in elevation to the surface 114t of the conductive element 114.

Subsequent to disposing the semiconductor device 12 to on the carrier 11, the holder 12 may be removed to form a semiconductor device package 1 as illustrated and described with reference to FIG. 1.

Figure 4D:
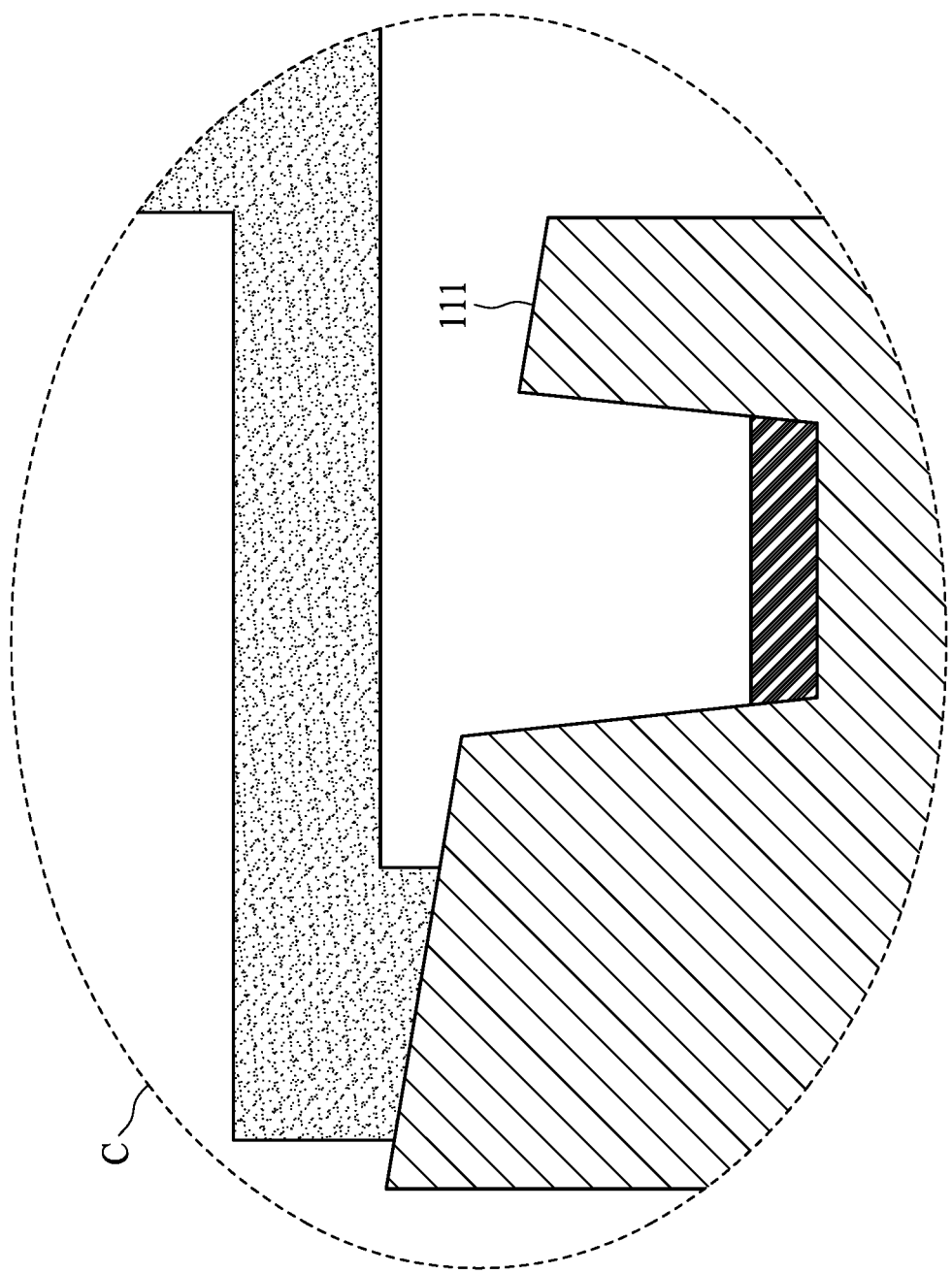
FIG. 4D illustrates an enlarged view of a portion of the semiconductor device package shown in FIG. 4C.

FIG. 4D illustrates an enlarged view of a portion of the embodiment in a dotted-circle "C" as shown in FIG. 4C. The contact head 23 may be varied in some other embodiments of the subject application. The contact head 23 may have a contact area (not denoted in FIG. 4D) which can conform to the surface 111 of the carrier 11. The contact head 23 may have a contact area (not denoted in FIG. 4D) which may be conformal to the surface 111 of the carrier 11. For example, carrier 11 may have a sloped surface (e.g., resulted from manufacturing deviation or tolerance), and the contact head 23 may be formed to be conformal to the substantially sloped surface 111.

FIG. 4A, FIG. 4B, FIG. 4C and FIG. 4E illustrate a method of manufacturing a semiconductor device package in accordance with some embodiments of the subject application.

Operations with reference to FIG. 4A, FIG. 4B and FIG. 4C are discussed above and therefore will be omitted in the following description for simplicity.

Figure 4E:
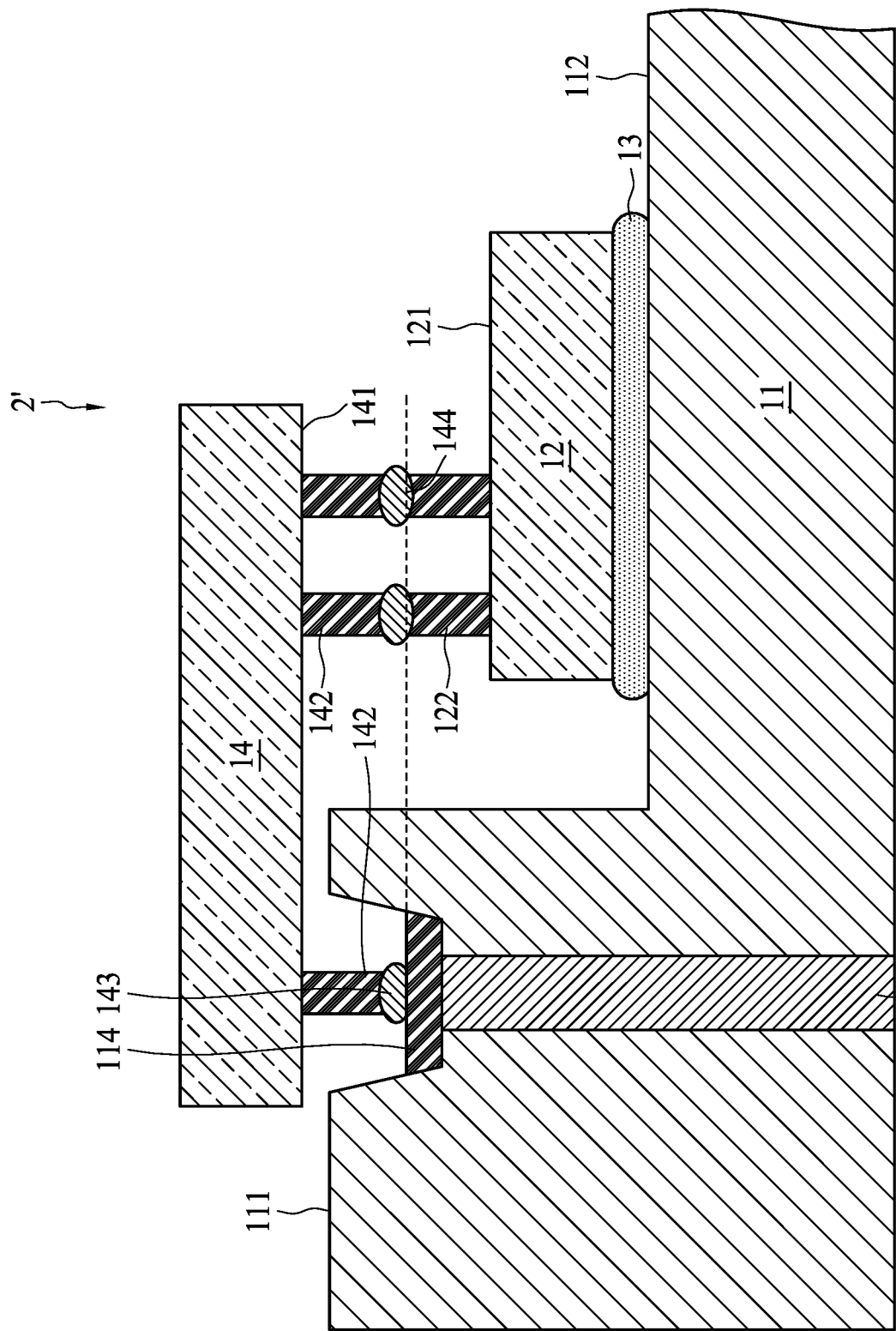

Referring to FIG. 4E, a semiconductor device 14 along with conductive elements 142 are bonded on the conductive element 114 and the conductive elements 122 on the semiconductor device 12, and a semiconductor device package 2' is formed. The bonding point 143 between the conductive element 142 and the conductive element 114 may include a solder ball, solder paste, a presolder or other suitable material(s). Similarly, the bonding point 144 between the conductive element 142 and the conductive element 122 may include a solder ball, solder paste, a presolder or other suitable material(s). According to the method described in the subject application, the bonding point 143 and the bonding point 144 may be formed to be substantially coplanar.

An encapsulant 15 may be used to encapsulate the conductive element 122 to form a semiconductor device package 2 as illustrated and described with reference to FIG. 3. An encapsulant 15 may be formed to encapsulate the conductive element 142.

The encapsulant 15 may include epoxy resin. The encapsulant 15 may include a capillary underfill (CUF), a molded underfill (MUF) or a dispensing gel, depending on design specifications. The encapsulant 15 may include a molding compound (e.g., an epoxy molding compound or other molding compound). The encapsulant 15 may include a polyimide. The encapsulant 15 may include a phenolic compound or material. The encapsulant 15 may include fillers or particles (e.g., silica particles).

Figure 4F:
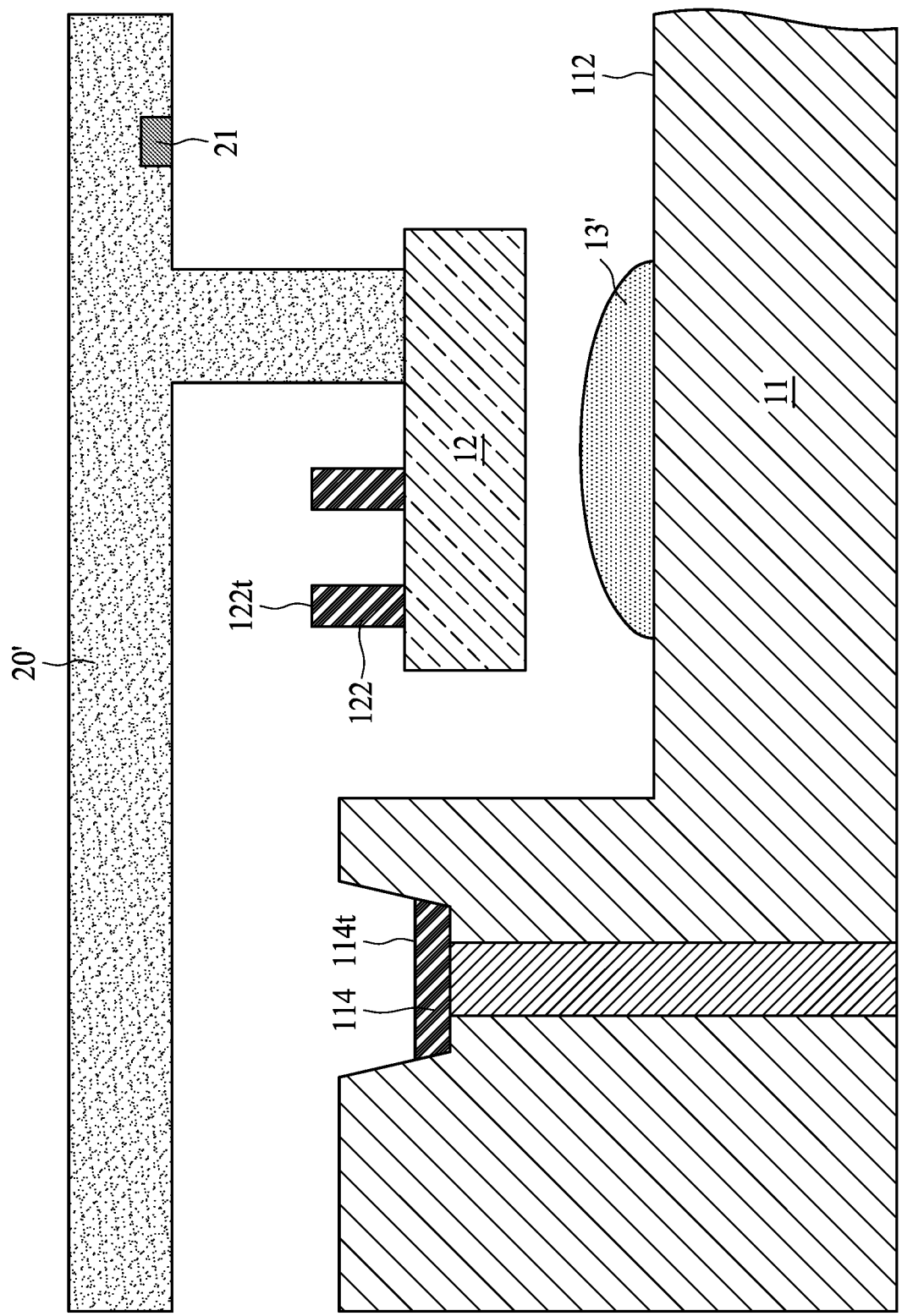

FIG. 4A and FIG. 4F illustrate a method of manufacturing a semiconductor device package in accordance with some embodiments of the subject application. Operations with reference to FIG. 4A are discussed above and therefore will be omitted in the following description for simplicity.

Referring to FIG. 4F, a holder 20' is used to pick up the semiconductor device 12 and to dispose the semiconductor device 12 on the carrier 11. The holder 20' is similar to the holder 20 as described and illustrated with reference to FIG. 4B or FIG. 4C, except that the contact head 23 is eliminated in the holder 20' and the holder 20' further includes an alignment element 21. The alignment element 21 may include an optical emitter, for example but is not limited to, a light emitting diode (LED), a laser emitter, an infrared light source, et. The alignment element 21 may include an optical receiver or detector.

A planarization material 13' is disposed on the surface 112 of the carrier 11. The holder 20' picks the semiconductor device 12 including conductive elements 122. Then, the holder 20' moves the semiconductor device 12 toward the surface 112 of the carrier 11. The alignment element 21 can determine distance between the alignment element 21 and the surface 112 to control movement of the holder 20'. Subsequent to disposing the semiconductor device 12 to on the carrier 11, the holder 12' may be removed to form a semiconductor device package 1 as illustrated and described with reference to FIG. 1.

However, accuracy of the determination of the distance may be affected by various parameters, e.g. planarity, smoothness, or roughness of surface 112 of the carrier 11. Accuracy of the determination of the distance may be affected by optical parameters such as color, index of reflection (IOR) or brightness of the carrier 11 or other environmental issues. Movement of the holder 20' as well as the semiconductor device 12 may be controlled by the determination of the distance.

In some embodiments where coplanarity of surface 112t and surface 114t is not that critical, the method as described and illustrated with reference to FIG. 4A and FIG. 4F may be used to form such semiconductor device package.

Figure 5A:
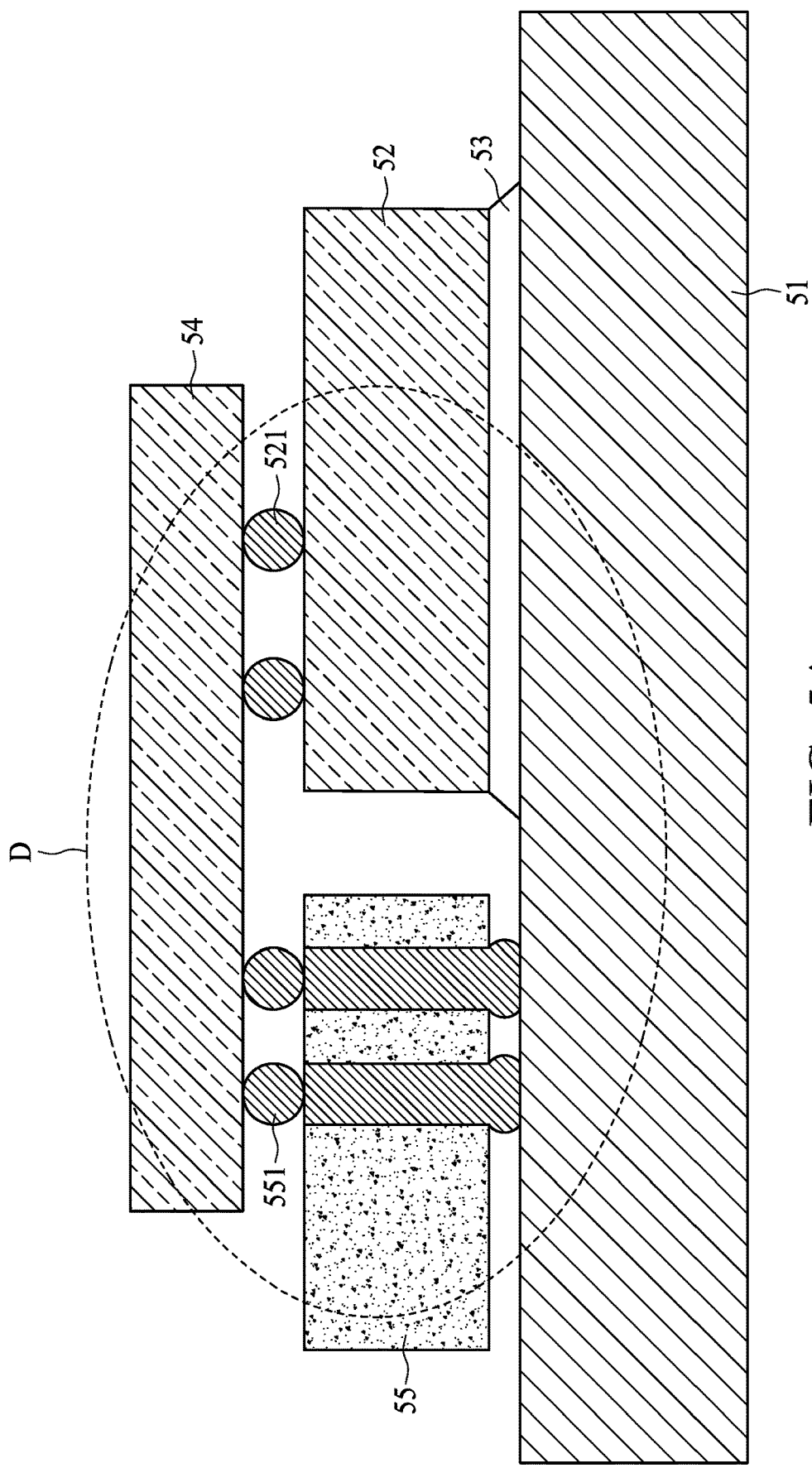
FIG. 5A illustrates a cross-sectional view of a semiconductor device package in accordance with some comparative embodiments.

FIG. 5A illustrates a semiconductor device package in accordance with some comparative embodiments of the subject application.

A carrier 55 is bonded to a carrier 51. An adhesive or adhesive material is formed on the carrier 51. The carrier 55 is bonded to the carrier 51 via connection elements which may include solder balls. A semiconductor device 52 is attached to the carrier 51. The semiconductor device 52 is attached to the carrier 51 by the adhesive material. After attaching the semiconductor device 52 onto the adhesive material, a curing operation may be performed to cure adhesive material to form an adhesive layer 53.

Connections 551 are formed on the carrier 55. The connections elements 551 may be formed by, for example but not limited to, implantation techniques. The connection elements 551 may include conductive bumps or posts. The connection elements 551 may include solder balls.

Connections elements 521 are formed on the semiconductor device 52. The connections elements 521 may be formed by, for example but not limited to, implantation techniques. The connection elements 521 may include conductive bumps or posts. The connection elements 521 may include solder balls.

A semiconductor device 54 is bonded to the semiconductor device 52 and the carrier 55, and a reflow operation is performed to form the semiconductor device package as shown in FIG. 5A, according to the present comparative example.

Figure 5B:
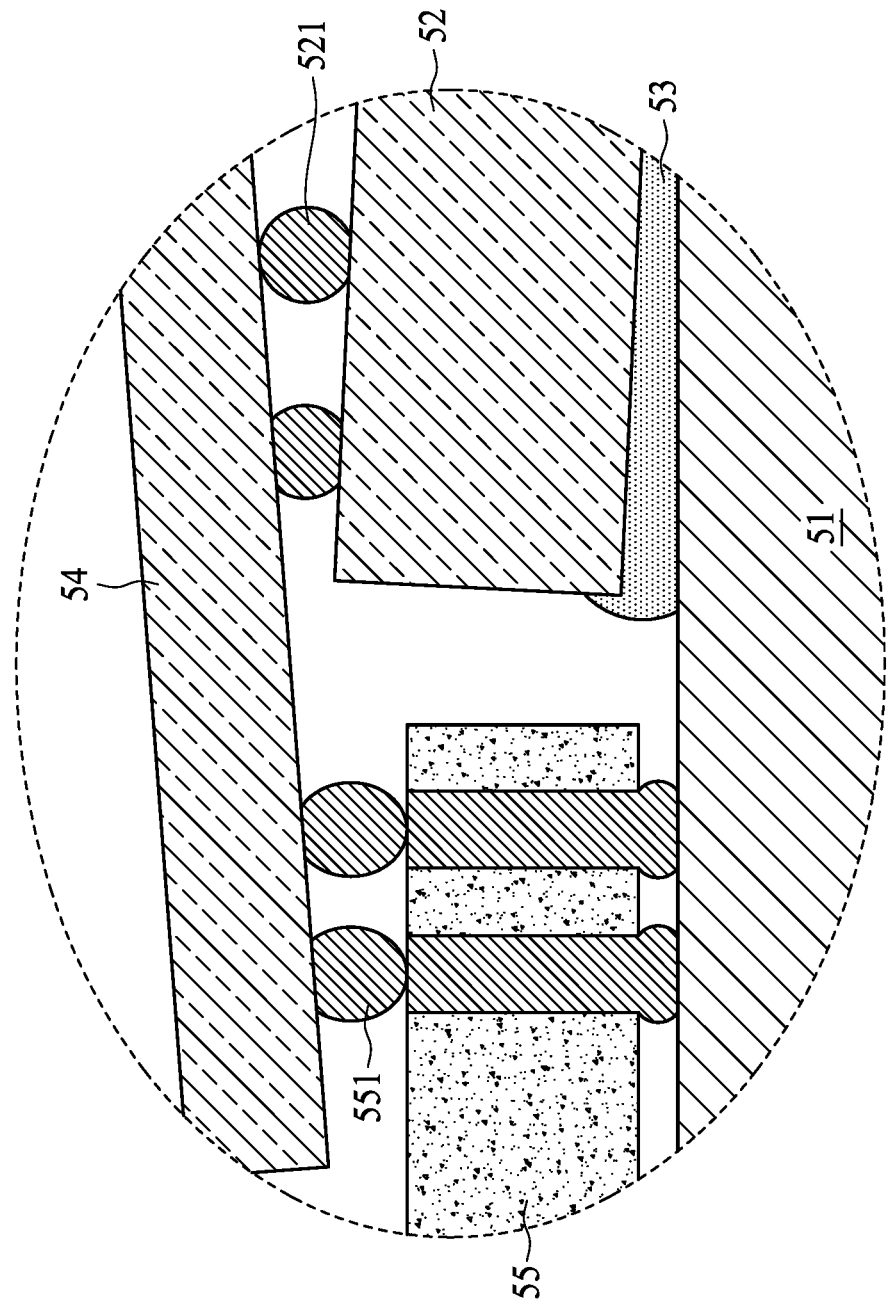
FIG. 5B illustrates an enlarged view of a portion of the semiconductor device package shown in FIG. 5A.

FIG. 5B illustrates an enlarged view of a portion of the semiconductor device package in a dotted-circle "D" as shown in FIG. 5A. The adhesive layer 53 may have an uneven bond-line thickness (BLT) caused by characteristics of the adhesive (e.g., a viscosity, a temperature, a volume of the adhesive and the like). An unevenness of the thickness of the adhesive layer 53 may lead to tilt of the semiconductor device 52.

There may be a height difference among the connection elements 521 (e.g., resulting from a manufacturing deviation or tolerance). There may be a height difference among the connection elements 551 (e.g., resulting from a manufacturing deviation or tolerance). The height difference among the connection elements 521 may lead to tilt of the semiconductor device 54. The height difference among the connection elements 551 may lead to tilt of the semiconductor device 54. The tilt of the semiconductor device 54 can adversely affect a reliability of the connection elements 521 and 551. The tilt of the semiconductor device 54 can adversely affect performance of the semiconductor device package (e.g., breaking or cracking of the connection elements 521 and 551).

It may be challenging to manufacture or make solder balls with a substantially identical diameter. Furthermore, it may be challenging to control a size or a height of the solder balls subsequent to a reflow operation. For example, it may be challenging to manufacture or make conductive posts with a substantially identical height because a deviation or a tolerance is highly likely in certain operations (e.g., plating, etching or other operation(s)).

Deviation or tolerance as discussed above may be ignored or neglected in some comparative embodiments where height control is not relatively critical. In other words, in some comparative embodiments where a horizontal bonding plane or surface (e.g. an imaginary plane defined by connection elements 521 and 551, or an imaginary plane defined by adhesive layer 53) is not relatively critical (e.g. due to a relatively large scale of the package), deviation or tolerance as discussed above may not hugely affect performance of the semiconductor device package. However, in some comparative embodiments where height control is desired, deviation or tolerance as discussed above may adversely affect performance of the semiconductor device package.

Figure 6A:
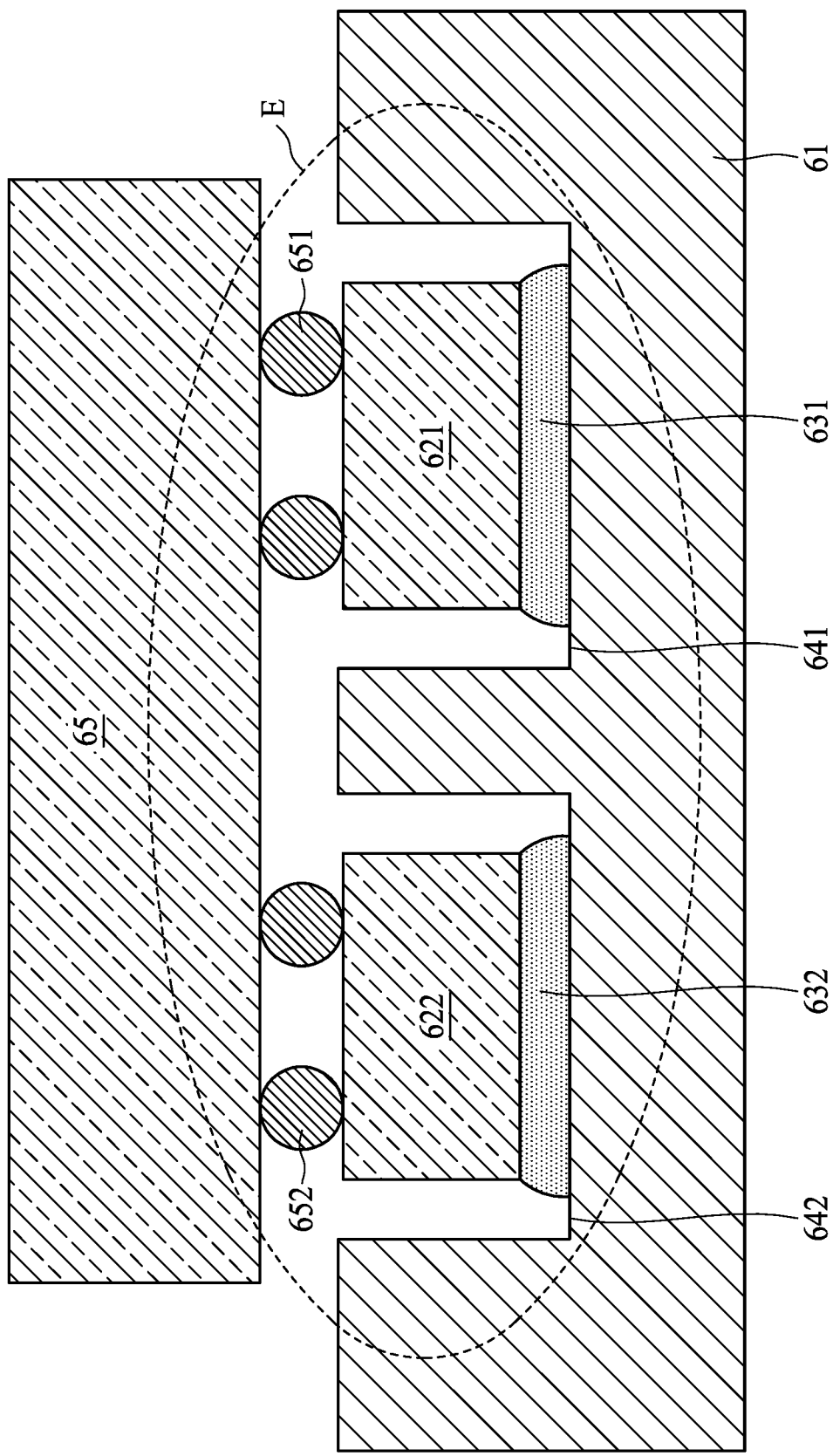
FIG. 6A illustrates a cross-sectional view of a semiconductor device package in accordance with some comparative embodiments.

FIG. 6A illustrate a semiconductor device package in accordance with some comparative embodiments of the subject application. The carrier 61 is formed to have recesses having surfaces 641, 642. The semiconductor device 621 is attached onto the surface 641 of the carrier 61. The semiconductor device 622 is attached onto surface 642 of the carrier 61. The semiconductor devices 621, 622 are attached to the carrier 61 by an adhesive material.

After attaching the semiconductor devices 621, 622 onto the adhesive material, a planarization operation is applied onto the semiconductor devices 621, 622 by applying a planarization head with a pressure. While the planarization operation is implemented, the adhesive material is compressed by the semiconductor devices 621, 622. A curing operation may be performed to cure adhesive material to form adhesive layers 631, 632.

Connections 651 are formed on the semiconductor device 621. The connections elements 651 may be formed by, for example but not limited to, implantation techniques. The connection elements 651 may include conductive bumps or posts. The connection elements 651 may include solder balls.

Connections elements 652 are formed on the semiconductor device 622. The connections elements 652 may be formed by, for example but not limited to, implantation techniques. The connection elements 652 may include conductive bumps or posts. The connection elements 652 may include solder balls.

A semiconductor device 65 is bonded to the semiconductor devices 621 and the semiconductor devices 622, and a reflow operation is performed to form the semiconductor device package as shown in FIG. 6A, according to the present comparative embodiments.

Figure 6B:
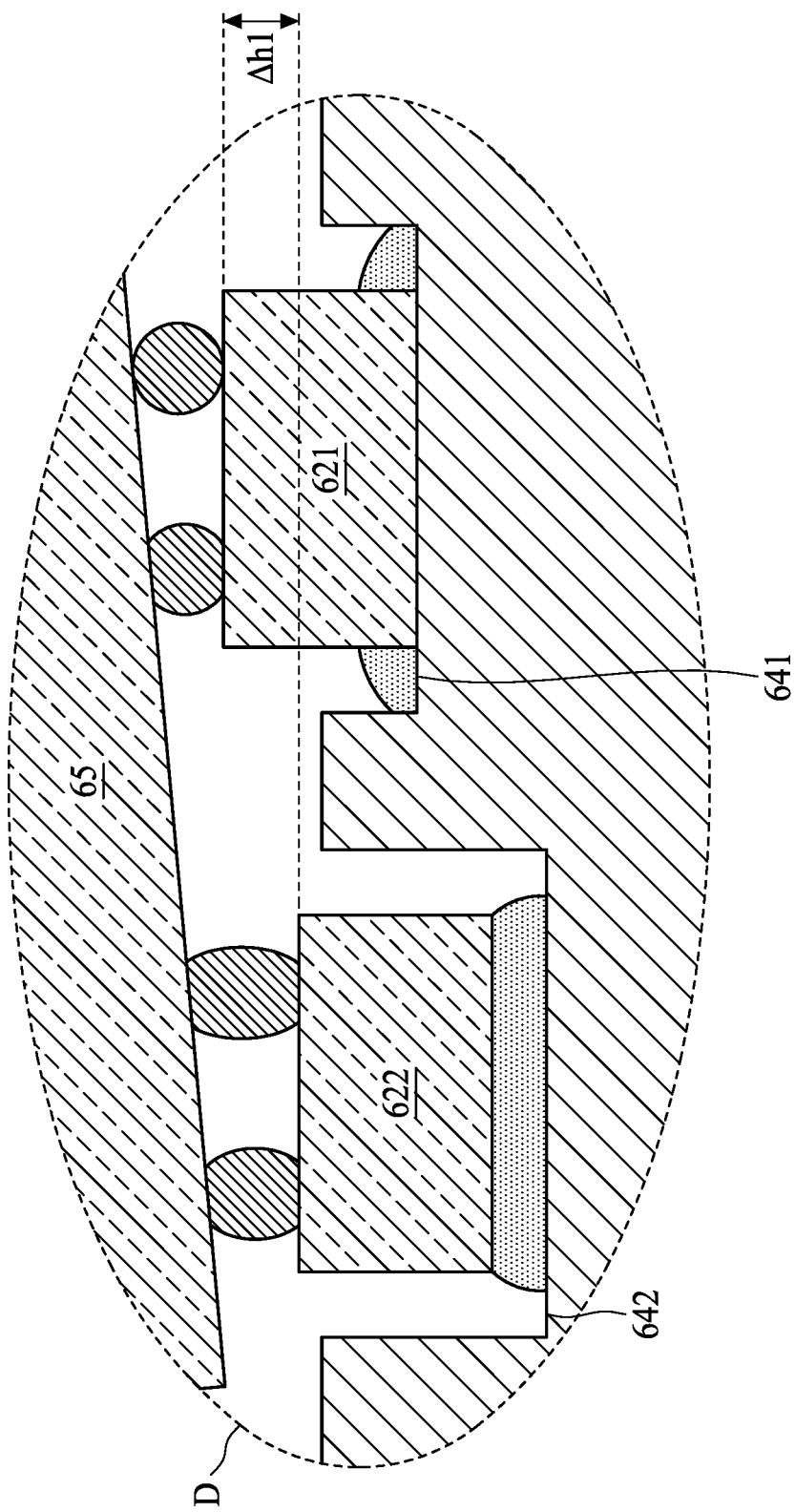
FIG. 6B illustrates an enlarged view of a portion of the semiconductor device package shown in FIG. 6A.

FIG. 6B illustrates an enlarged view of a portion of the semiconductor device package in a dotted-circle "E" as shown in FIG. 6A. There may be depth difference among the recesses (e.g., resulting from a manufacturing deviation or tolerance). The surface 641 may be formed substantially not the same in elevation to the surface 642. Upon the planarization operation is applied to the semiconductor devices 621, 622 by applying a planarization head, the bottom surface of the semiconductor 621 may contact the surface 641. However, the top surface of the semiconductor device 621 may be higher than the top surface of the semiconductor device 622, which leads to an elevation difference $\Delta h1$ between the top surface of the semiconductor device 621 and the top surface of the semiconductor device 622. If the planarization head continues to apply a force onto the semiconductor device 621, it may cause the semiconductor device 621 to be cracked or damaged.

When semiconductor 65 is deposited over or above the semiconductor device 621 and the semiconductor 622, the un-coplanar of the top surface of the semiconductor device 621 and the top surface of the semiconductor 622 may lead to tilt of the semiconductor device 65. The tilt of the semiconductor device 65 can adversely affect performance of the semiconductor device package (e.g., breaking or cracking of the connection elements among the semiconductor device 65 and the semiconductor device 621, and breaking or cracking the connection elements among the semiconductor device 65 and the semiconductor device 622).

Figure 6C:
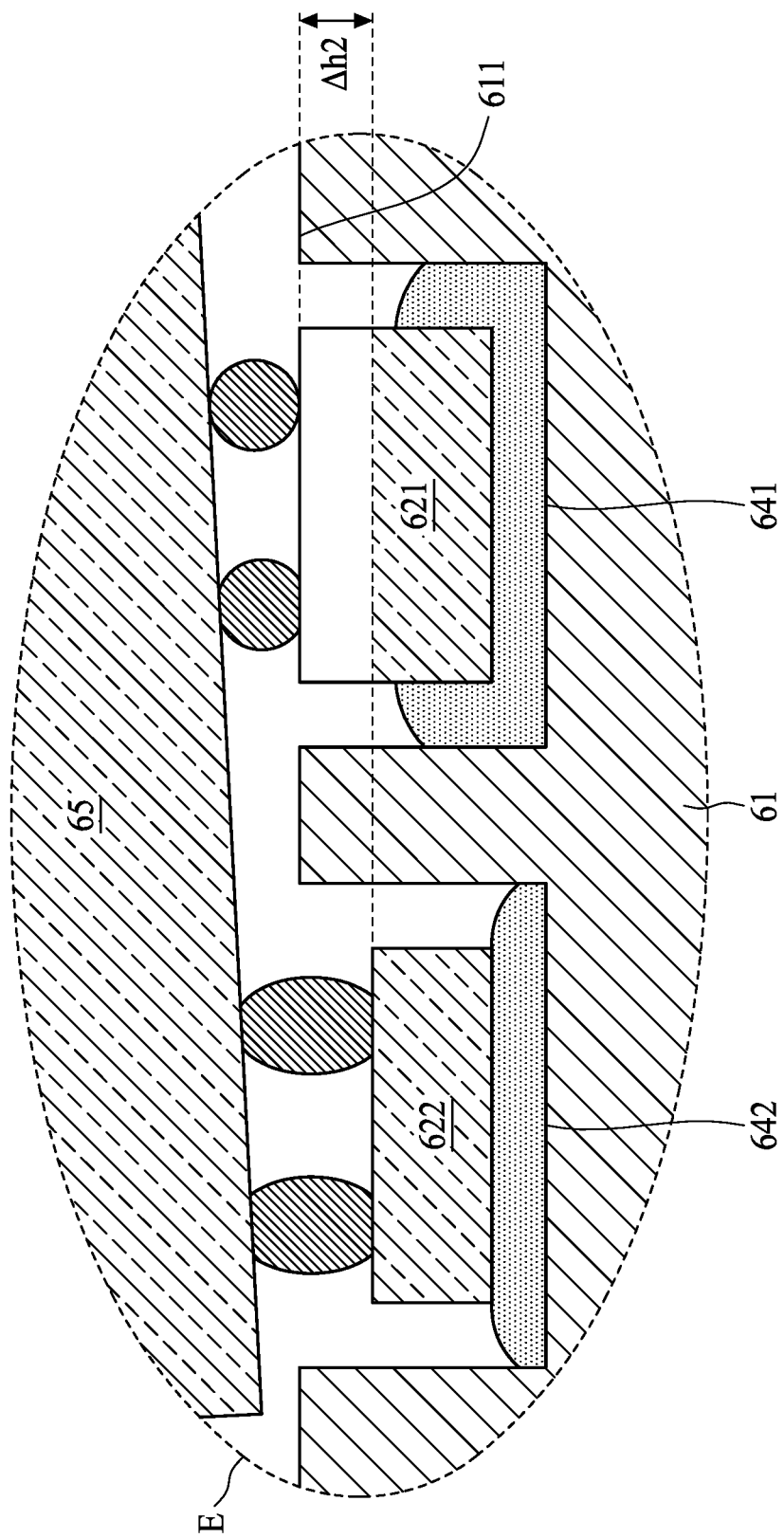
FIG. 6C illustrates an enlarged view of a portion of the semiconductor device package shown in FIG. 6A.

FIG. 6C illustrates an enlarged view of a portion of the semiconductor device package in a dotted-circle "E" as shown in FIG. 6A. There may be thickness difference among the semiconductor device 621 and semiconductor device 622 (e.g., resulting from a manufacturing deviation or tolerance). The thickness of the semiconductor device 621 may be greater than the thickness of the semiconductor device 622. Upon the planarization operation is applied to the semiconductor devices 621, 622 by applying a planarization head, the top surface of the semiconductor 621 may be coplanar with the surface 611 of the carrier 61. However, the top surface of the semiconductor device 621 may be un-coplanar with the top surface of the semiconductor device 622. The top surface of the semiconductor device 621 may be higher than the top surface of the semiconductor device 622, which leads to a level difference $\Delta h2$ between the top surface of the semiconductor device 621 and the top surface of the semiconductor device 622.

When semiconductor 65 is deposited over or above the semiconductor device 621 and the semiconductor 622, the non-coplanar of the top surface of the semiconductor device 621 and the top surface of the semiconductor 622 may lead to tilt of the semiconductor device 65. The tilt of the semiconductor device 65 can adversely affect performance of the semiconductor device package.

As described in the previous embodiments of the subject application, the surface 641 and the surface 642 may be substantially sloped. The surface 641 and the surface 642 may be substantially uneven. Upon the semiconductor device 621 is deposited on the substantially sloped and/or uneven surface 641, and the semiconductor device 622 is deposited on the substantially sloped and/or uneven surface 642, the substantially sloped and/or uneven surface 641 and the surface 642 in the comparative example would lead to un-coplanar of the top surface of the semiconductor device 621 and the top surface of the semiconductor device 622, and further lead to tilt of the semiconductor device 65 over or above the semiconductor devices 621, 622. The tile of the semiconductor device 65 can adversely affect performance of the semiconductor device package.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the subject application has been described and illustrated with reference to specific embodiments thereof, these descriptions and illustrations do not limit the subject application. It can be clearly understood by those skilled in the art that various changes may be made, and equivalent components may be substituted within the embodiments without departing from the true spirit and scope of the subject application as defined by the appended claims. The illustrations may not necessarily be drawn to scale. There may be distinctions between the artistic renditions in the subject application and the actual apparatus, due to variables in manufacturing processes and such. There may be other embodiments of the subject application which are not specifically illustrated. The specification and drawings are to be regarded as illustrative rather than restrictive. Modifications may be made to adapt a particular situation, material, composition of matter, method, or process to the objective, spirit and scope of the subject application. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the subject application. Therefore, unless specifically indicated herein, the order and grouping of the operations are not limitations of the subject application.

What is claimed is:

1. A semiconductor device package, comprising:
a carrier having a first surface and a second surface;
an optical device disposed over the first surface of carrier, wherein the optical device has a first surface;
a leveling layer interposed between the first surface of the carrier and the optical device and configured to make the first surface of the optical device substantially parallel with the second surface of the carrier; and
a semiconductor device disposed above and across the optical device and the second surface of the carrier.

2. The semiconductor device package of claim 1, wherein an elevation of the first surface of the optical device above the first surface of the carrier is lower than an elevation of the second surface of the carrier above the first surface of the carrier.

3. The semiconductor device package of claim 1, wherein a top surface or a bottom surface of the semiconductor device is non-parallel to the first surface of the optical device.

4. A semiconductor device package, comprising:
a carrier having a first surface and a second surface;
an optical device disposed over the first surface of carrier, wherein the optical device has a first surface; and
a leveling layer interposed between the first surface of the carrier and the optical device and configured to make the first surface of the optical device substantially parallel with the second surface of the carrier;
wherein the optical device further has a first lateral surface angled to the first surface of the optical device, and the leveling layer extends beyond the first lateral surface of the optical device.

5. The semiconductor device package of claim 4, wherein the optical device further has a second lateral surface angled to the first surface of the optical device, and a portion of the leveling layer extends beyond the second lateral surface of the optical device.

6. A semiconductor device package, comprising:
a carrier having a first surface and a second surface;
an optical device disposed over the first surface of carrier, wherein the optical device has a first surface; and
a leveling layer interposed between the first surface of the carrier and the optical device and configured to make the first surface of the optical device substantially parallel with the second surface of the carrier;
wherein the optical device comprises a first conductive element, the carrier comprises a second conductive element exposed from the second surface of the carrier, and the leveling layer is configured to make the first conductive element and the second conductive element substantially at a same level.

7. The semiconductor device package of claim 6, wherein the first conductive element has a surface, the second conductive element has a surface, and the leveling layer is configured to make the surface of the first conductive element substantially parallel to the surface of the second conductive element.

8. A semiconductor device package, comprising:
a carrier having a first upper surface, a second upper surface and a lateral surface extending between the first upper surface and the second upper surface, wherein the lateral surface and the second upper surface jointly define a cavity;
an optical device disposed in the cavity and having an upper surface, wherein an elevation of the first upper surface of the carrier is higher than an elevation of the upper surface of the optical device; and
a semiconductor device disposed over the carrier and the optical device, wherein a width of the semiconductor device projected on the first upper surface is less than a width of the semiconductor device projected on the second upper surface.

9. A semiconductor device package, comprising:
a carrier having a first upper surface, a second upper surface and a lateral surface extending between the first upper surface and the second upper surface, wherein the lateral surface and the second upper surface jointly define a cavity;
an optical device disposed in the cavity and having an upper surface, wherein an elevation of the first upper surface of the carrier is higher than an elevation of the upper surface of the optical device; and
a semiconductor device disposed over the carrier and the optical device, wherein a width of a downward projection area of the semiconductor device on the upper surface of the optical device is greater than a width of a portion of the upper surface of the optical device outside the downward projection area of the semiconductor device.

10. The semiconductor device package of claim 8, wherein the second upper surface of the carrier is formed by removing a portion of the carrier.

11. A semiconductor device package, comprising:
a carrier having a first upper surface, a second upper surface and a lateral surface extending between the first upper surface and the second upper surface, wherein the lateral surface and the second upper surface jointly define a cavity;
an optical device disposed in the cavity and having an upper surface, wherein an elevation of the first upper surface of the carrier is higher than an elevation of the upper surface of the optical device;
a semiconductor device disposed over the carrier and the optical device, and electrically connecting the carrier with the optical device; and
an encapsulant including a first portion connecting the carrier with the semiconductor device and a second portion connecting the optical device with the semiconductor device, wherein a thickness of the first portion is less than a thickness of the second portion.

12. The semiconductor device package of claim 11, wherein an elevation of a lower surface of the first portion is higher than an elevation of a lower surface of the second portion.

13. A semiconductor device package, comprising:
a carrier having a first upper surface, a second upper surface and a lateral surface extending between the first upper surface and the second upper surface, wherein the lateral surface and the second upper surface jointly define a cavity;
an optical device disposed in the cavity and having an upper surface, wherein an elevation of the first upper surface of the carrier is higher than an elevation of the upper surface of the optical device; and
a semiconductor device disposed over the carrier and the optical device, wherein the semiconductor device electrically connects the carrier with the optical device and includes a bottom surface, and a distance from the bottom surface of the semiconductor device to the first upper surface of the carrier is less than a distance from the bottom surface of the semiconductor device to the upper surface of the optical device.

14. The semiconductor device package of claim 8, further comprising an adhesive layer interposed between the lateral surface of the carrier and the optical device.

15. The semiconductor device package of claim 14, wherein the optical device has a first lateral surface, and the adhesive layer extends beyond the first lateral surface of the optical device.

16. The semiconductor device package of claim 15, further comprising a-semiconductor device disposed above the optical device, wherein the optical device further has a second lateral surface opposite to the first lateral surface, and the second semiconductor device overlaps the second lateral surface of the optical device.

17. The semiconductor device package of claim 16, wherein the semiconductor device is disposed above and across the optical device and the first upper surface of the carrier.

18. The semiconductor device package of claim 17, wherein a length of a projection of the semiconductor device on the first upper surface of the carrier is greater than a length of a projection of the semiconductor device on the optical device.

* * * * *